United States Patent
Lee et al.

(10) Patent No.: US 11,183,451 B2
(45) Date of Patent: Nov. 23, 2021

(54) INTERCONNECT CLIP WITH ANGLED CONTACT SURFACE AND RAISED BRIDGE

(71) Applicant: Infineon Technologies AG, Neubiberg (DE)

(72) Inventors: Chai Chee Lee, Melaka (MY); Wee Boon Tay, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/991,532

(22) Filed: Aug. 12, 2020

(65) Prior Publication Data
US 2021/0074628 A1    Mar. 11, 2021

Related U.S. Application Data

(63) Continuation-in-part of application No. 16/561,714, filed on Sep. 5, 2019.

(51) Int. Cl.
| | |
|---|---|
| H01L 23/522 | (2006.01) |
| H01L 21/56 | (2006.01) |
| H01L 23/31 | (2006.01) |
| H01L 23/528 | (2006.01) |

(52) U.S. Cl.
CPC .......... *H01L 23/5221* (2013.01); *H01L 21/56* (2013.01); *H01L 23/3107* (2013.01); *H01L 23/5283* (2013.01)

(58) Field of Classification Search
CPC combination set(s) only.
See application file for complete search history.

(56) References Cited

U.S. PATENT DOCUMENTS

| | | | | | |
|---|---|---|---|---|---|
| 5,966,893 | A | * | 10/1999 | Quillin | F16B 5/0028 52/282.2 |
| 7,271,470 | B1 | * | 9/2007 | Otremba | H01L 23/49537 257/666 |
| 10,825,757 | B2 | * | 11/2020 | Fan | H01L 24/40 |
| 2010/0164078 | A1 | * | 7/2010 | Madrid | H01L 24/40 257/675 |
| 2016/0336257 | A1 | * | 11/2016 | Choi | H01L 24/37 |
| 2016/0358843 | A1 | * | 12/2016 | Arokiasamy | H01L 24/40 |
| 2017/0250126 | A1 | | 8/2017 | Ostrowicki | |
| 2020/0105648 | A1 | * | 4/2020 | Prajuckamol | H01L 24/29 |

FOREIGN PATENT DOCUMENTS

KR    1020150097923 A    8/2015

* cited by examiner

*Primary Examiner* — Mamadou L Diallo

(74) *Attorney, Agent, or Firm* — Murphy, Bilak & Homiller, PLLC

(57) ABSTRACT

An interconnect clip includes a die contact portion having substantially planar upper and lower surfaces that are parallel to and opposite from one another, a bridge portion adjoining the die contact portion and having substantially planar upper and lower surfaces that are parallel to and opposite from one another, a lead contact portion adjoining the bridge portion and having a lead contact surface or contact point, and a bridge portion adjoining the die contact portion and having substantially planar upper and lower surfaces that are parallel to and opposite from one another. The lower surface of the die contact portion extends along a first plane. The lower surface of the bridge portion extends along a second plane that is completely above the first plane throughout a complete length of the bridge portion. The lead contact surface or contact point is disposed below the first plane.

20 Claims, 10 Drawing Sheets

INTERCONNECT CLIP WITH ANGLED CONTACT SURFACE AND RAISED BRIDGE

PRIORITY CLAIM

This application is a continuation-in-part of and claims priority to U.S. application Ser. No. 16/561,714 filed on Sep. 5, 2019, the content of which is incorporated by reference herein in its entirety.

TECHNICAL FIELD

The present invention generally relates to semiconductor packaging and more particularly relates to interconnect clips and corresponding methods of making a metal interconnect clips.

BACKGROUND

Semiconductor packages are commonly provided with semiconductor dies, including discrete devices, e.g., transistors, diodes, etc., and integrated circuits, e.g., controllers, application specific devices, amplifiers, etc. In a typical semiconductor package, the semiconductor die is mounted on a carrier structure, such as a die pad. An electrically insulating encapsulant material such as plastic or ceramic encapsulates the semiconductor die, thereby protecting the semiconductor die and associated electrical connections from moisture and dust particles. A semiconductor package typically includes a number of electrically conductive lead that are exposed from the encapsulant material and provide externally accessible terminals of the device.

Metal clips represent one type of interconnect solution for electrically connecting the terminals of a semiconductor die to package leads. In comparison to bond wires, metal clips provide superior current carrying capability and thermal performance. Generally speaking, designers seek to make metal package clips as thick as possible so as to minimize electrical and/or thermal resistivity. However, this design goal is constrained by package specific factors such as die size, minimum spacing between the die and clip, encapsulant body size, etc. Designers are continuously seeking ways to increase clip thickness, and hence improve performance, while maintaining a high die to package size ratio.

SUMMARY

An interconnect clip is disclosed. According to an embodiment, the interconnect clip includes a die contact portion comprising substantially planar upper and lower surfaces that are parallel to and opposite from one another, a bridge portion adjoining the die contact portion and comprising substantially planar upper and lower surfaces that are parallel to and opposite from one another, a lead contact portion adjoining the bridge portion and comprising first and second substantially planar lower surfaces that form an angled intersection with one another at a contact point, a first transition surface extending transversely from the lower surface of the bridge portion and reaching the lower surface of the die contact portion, and a second transition surface extending transversely from the lower surface of the bridge portion and reaching the first lower surface of the lead contact portion. The lower surface of the die contact portion extends along a first plane. The lower surface of the bridge portion extends from the first transition surface to the second transition surface along a second plane that is completely above the first plane. The first lower surface of the lead contact portion is tilted relative to the first plane.

Separately or in combination, a thickness of the bridge portion is substantially uniform throughout a length of the bridge portion, the length of the bridge portion spanning from the first transition surface to the second transition surface.

Separately or in combination, the upper surface of the bridge portion is substantially coplanar with the upper surface of the die contact portion.

Separately or in combination, the second plane is substantially parallel to the first plane.

Separately or in combination, the lead contact portion further comprises a first substantially planar upper surface that is opposite from and parallel to the first lower surface of the lead contact portion, and a thickness of the lead contact portion is substantially equal to the thickness of the bridge portion, the thickness of the lead contact portion being a shortest distance between the first upper surface and first lower surface of the lead contact portion.

According to another embodiment, the interconnect clip comprises a die contact portion comprising opposing upper and lower surfaces a bridge portion adjoining the die contact portion and comprising opposing upper and lower surfaces, a lead contact portion adjoining the bridge portion and comprising a lead contact surface or contact point. The lower surface of the die contact portion extends along a first plane. The lower surface of the bridge portion extends along a second plane that is completely above the first plane throughout a complete length of the bridge portion.

Separately or in combination, the interconnect clip further comprises a first transition surface extending transversely from the lower surface of the bridge portion and reaching the lower surface of the die contact portion, and a second transition surface extending transversely from the lower surface of the bridge portion and reaching the lead contact surface or contact point of the lead contact portion, wherein the complete length of the bridge portion begins at the first transition surface and ends at the second transition surface.

Separately or in combination, a thickness of the bridge portion is substantially uniform throughout the complete length of the bridge portion, the thickness of the bridge portion being measured between the upper and lower surfaces of the bridge portion.

Separately or in combination, the lead contact portion comprises the lead contact surface, and the lead contact surface is a substantially planar lower surface of the interconnect clip that extends along a third plane that is completely below the first plane.

Separately or in combination, the lead contact surface extends to an outer end surface of the interconnect clip that extends transversely to the lead contact surface.

Separately or in combination, the second transition surface is a continuous planar surface that is tilted relative to the lower surface of the bridge portion and extends from the lower surface of the bridge portion to the lead contact surface.

Separately or in combination, the lead contact surface or contact point is disposed below the first plane.

A semiconductor package assembly is disclosed. According to an embodiment, the semiconductor package assembly includes a die pad comprising a die attach surface, an electrically conductive lead spaced apart from the die pad and comprising a substantially planar contact pad, a semiconductor die mounted on the die pad and comprising a first terminal disposed on an upper surface of the semiconductor die, the upper surface of the semiconductor die facing away from the die attach surface, and an interconnect clip electrically connecting the first terminal to the lead. The interconnect clip comprises a die contact portion that comprises substantially planar upper and lower surfaces that are parallel to and opposite from one another, a bridge portion adjoining the die contact portion and comprising substantially planar upper and lower surfaces that are parallel to and opposite from one another, and a lead contact portion adjoining the bridge portion and comprising first and second substantially planar lower surfaces that form an angled intersection with one another at a contact point. The lower surface of the die contact portion is flush against the upper surface of the semiconductor die. The contact point is mechanically coupled to the lead with the first lower surface of the lead contact portion being tilted relative to the contact pad. The lower surface of the die contact portion extends along a first plane that is parallel to the upper surface of the semiconductor die. The lower surface of the bridge portion extends from a first location to a second location along a second plane that is completely above the first plane. The first location is directly above the semiconductor die. The second location is directly above the contact pad.

Separately or in combination, a thickness of the bridge portion is substantially uniform throughout a length of the bridge portion, the length of the bridge portion spanning from the first location to the second location.

Separately or in combination, the upper surface of the bridge portion is substantially coplanar with the upper surface of the die contact portion.

Separately or in combination, the contact point is below the first plane.

Separately or in combination, a lateral edge side of the semiconductor die extends past an edge side of the die pad and is disposed directly below the lower surface of the bridge portion.

Separately or in combination, the lead contact portion further comprises a first substantially planar upper surface that is opposite from and parallel to the first lower surface of the lead contact portion, and wherein a thickness of the lead contact portion is substantially equal to the thickness of the bridge portion, the thickness of the lead contact portion being a distance between the first upper surface and first lower surface of the lead contact portion.

Separately or in combination, the semiconductor package assembly further comprises an electrically insulating encapsulant body that encapsulates the semiconductor die, the encapsulant body comprises an upper surface, a lower surface, and a side surface extending between the upper and lower surfaces, the lead contact portion further comprises a second substantially planar upper surface that forms an angled intersection with the first planar upper surface of the lead contact portion, and the second upper surface of the lead contact portion is substantially parallel to the side surface of the encapsulant body.

Separately or in combination, the upper surface of the die contact portion is exposed from the upper surface of the encapsulant body, and a lower surface of the die pad is exposed from the lower surface of the encapsulant body.

Separately or in combination, the second lower surface of the lead contact portion is parallel to and flush against the contact pad.

According to another embodiment, the semiconductor package assembly comprises a die pad comprising a die attach surface, an electrically conductive lead spaced apart from the die pad and comprising a substantially planar contact pad, a semiconductor die mounted on the die pad and comprising a first terminal disposed on an upper surface of the semiconductor die, the upper surface of the semiconductor die facing away from the die attach surface, and an interconnect clip electrically connecting the first terminal to the lead, the interconnect clip comprising a die contact portion comprising upper and lower surfaces, a bridge portion adjoining the die contact portion and comprising upper and lower surfaces, and a lead contact portion adjoining the bridge portion and comprising a lead contact surface or contact point. The lower surface of the die contact portion is flush against the upper surface of the semiconductor die, the lead contact surface or contact point is electrically connected to the contact pad, the lower surface of the die contact portion extends along a first plane that is parallel to the upper surface of the semiconductor die, the lower surface of the bridge portion extends from a first location to a second location along a second plane that is completely above the first plane, the first location is directly above the semiconductor die, and the second location is directly above the contact pad.

Separately or in combination, a thickness of the bridge portion is substantially uniform throughout a length of the bridge portion, the length of the bridge portion spanning from the first location to the second location.

Separately or in combination, the upper surface of the bridge portion is substantially coplanar with the upper surface of the die contact portion.

Separately or in combination, the lead contact portion comprises the lead contact surface, and wherein the lead contact surface is flush against the contact pad.

Separately or in combination, the lead contact surface extends to an outer end surface of the interconnect clip that extends transversely to the lead contact surface.

Separately or in combination, the semiconductor package assembly further comprises an electrically insulating encapsulant body that encapsulates the semiconductor die, the encapsulant body comprises an upper surface, a lower surface, and a side surface extending between the upper and lower surfaces, and the outer end surface of the interconnect clip is substantially parallel to the side surface of the encapsulant body.

Separately or in combination, the upper surface of the die contact portion is exposed from the upper surface of the encapsulant body, and a lower surface of the die pad is exposed from the lower surface of the encapsulant body.

A method of forming an interconnect clip is disclosed. According to an embodiment, the method comprises providing a sheet metal, forming a die contact portion, a bridge portion and a first transition surface from the sheet metal, the bridge portion and the first transition surface each comprising substantially planar upper and lower surfaces that are parallel to and opposite from one another, the first transition surface extending transversely from the lower surface of the bridge portion to the lower surface of the die contact portion, forming a lead contact portion and a second transition surface from the sheet metal, the lead contact portion adjoining the bridge portion and comprising first and second substantially planar lower surfaces that form an angled intersection with one another at a contact point, the second transition surface extending transversely from the lower surface of the bridge portion to the first lower surface of the lead contact portion. The lower surface of the die contact portion is formed to extend along a first plane. The lower surface of the bridge portion is formed to extend along a second plane from the first transition surface to the second transition surface along a second plane that is completely above the first plane. The lead contact portion is formed such that the first lower surface of the lead contact portion is tilted relative to the first plane.

Separately or in combination, the sheet metal comprises substantially planar upper and lower surfaces that are parallel to and opposite from one another and an edge side extending between the upper and lower surfaces of the sheet metal, and wherein forming the die contact portion and the bridge portion comprises punching the lower surface of the sheet metal thereby forming a punched region that is thinner than an unpunched region and extends to the edge side, the unpunched region provides the upper and lower surfaces of the die contact portion, and the punched region provides the upper and lower surfaces of the bridge portion.

Separately or in combination, forming the lead contact portion comprises bending a portion of the punched region downward by applying a machine tool to the upper surface of the sheet metal in the punched region.

Separately or in combination, forming the lead contact portion further comprises applying an edged punch tool to the upper surface of the sheet metal in the punched region thereby offsetting the lead contact portion such that the contact point is below the first plane.

Separately or in combination, the method further comprises forming a first chamfer that extends between the upper surface and the edge side of the sheet metal, and the first chamfer is formed before bending the portion of the punched region downward.

Separately or in combination, the method further comprises forming a second chamfer that extends between the lower surface and the edge side of the sheet metal, and the second chamfer is formed before bending the portion of the punched region downward.

According to another embodiment, the method comprises providing a sheet metal, forming a die contact portion, a bridge portion and a first transition surface from the sheet metal, the die contact portion and the bridge portion each comprising opposing upper and lower surfaces, the first transition surface extending transversely from the lower surface of the bridge portion to the lower surface of the die contact portion, forming a lead contact portion from the sheet metal, the lead contact portion adjoining the bridge portion and comprising a lead contact surface or contact point. The lower surface of the die contact portion is formed to extend along a first plane. The lower surface of the bridge portion is formed to extend along a second plane that is completely above the first plane throughout a complete length of the bridge portion.

Separately or in combination, the sheet metal comprises substantially planar upper and lower surfaces that are parallel to and opposite from one another and an edge side extending between the upper and lower surfaces of the sheet metal, and wherein forming the die contact portion and the bridge portion comprises punching the lower surface of the sheet metal thereby forming a punched region that is thinner than an unpunched region and extends to the edge side, wherein the unpunched region provides the upper and lower surfaces of the die contact portion, and wherein the punched region provides the upper and lower surfaces of the bridge portion.

Separately or in combination, forming the lead contact portion comprises bending a portion of the punched region downward by applying a machine tool to the upper surface of the sheet metal in the punched region.

Separately or in combination, the lead contact portion is formed to comprise the lead contact surface, and the lead contact surface is a substantially planar lower surface of the interconnect clip that extends along a third plane that is completely below the first plane.

Separately or in combination, the lead contact surface is formed by arranging a planar pad beneath the punched region while the machine tool applies force to the upper surface of the sheet metal.

Separately or in combination, the planar pad provides counteracting force that maintains the lower surface of the sheet metal along a single plane while punched region bends downward by the force from the machine tool.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

An interconnect clip with advantageous geometric features is described herein. One advantageous feature is the lower surface profile of the interconnect clip. Specifically, the clip is designed such that, when mounted in a semiconductor package, a lower surface of the interconnect clip remains above the plane of the semiconductor die from a location that is directly over the die to a location that is directly over the package lead. This feature enables the semiconductor die to encroach closer to the edge side of the package, which in turn enables higher die to package size ratio. Another advantageous geometric feature of the interconnect clip is the thickness of the conduction path portion of the clip. Specifically, interconnect clip includes a bridge portion and a die contact portion that carry current between the semiconductor die and package lead, each of which having a thickness of at least 60 percent, in some embodiments, of the maximum thickness of the interconnect clip. As a result, the interconnect clip provides low resistive losses between the semiconductor die and lead.

An advantageous method for forming said interconnect clip is described herein. One advantage of this method is a two-step process that includes a bending step and half cutting step. This technique allows for the contacting end of the interconnect clip to have a desired vertical offset while simultaneously maintain a narrow contact interface.

Figure 1:
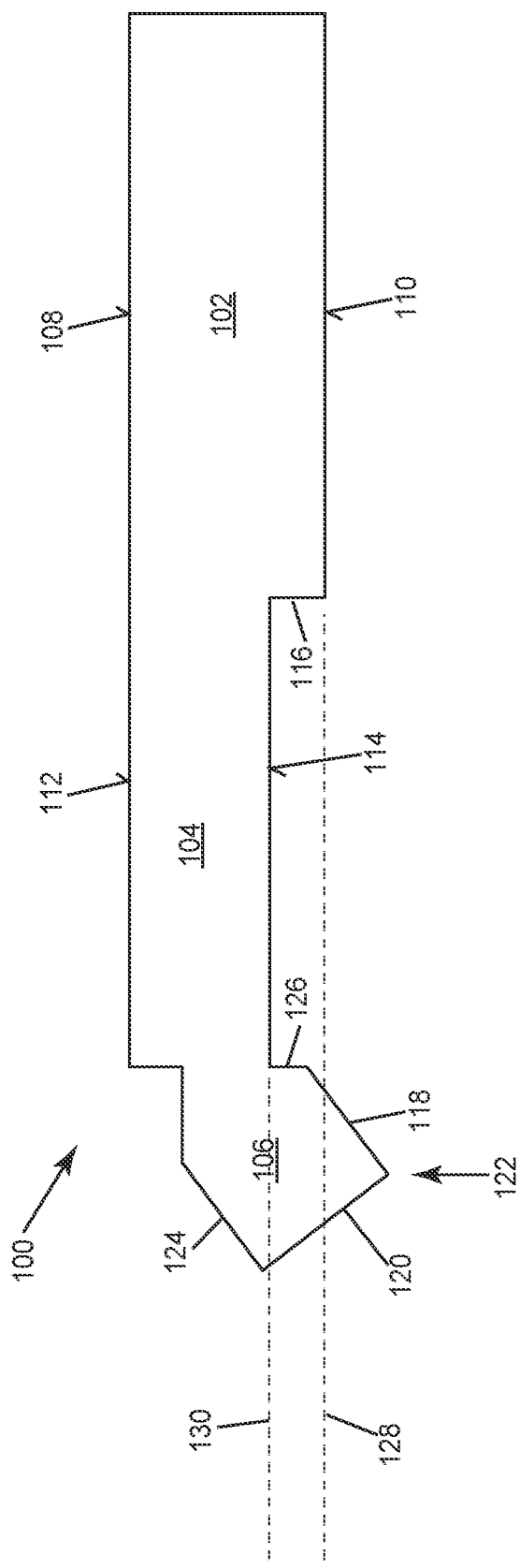
FIG. 1 depicts an interconnect clip, according to an embodiment.

Referring to FIG. 1, an interconnect clip 100 is depicted, according to an embodiment. The interconnect clip 100 is formed from an electrically conductive material such as copper, aluminum, alloys thereof, etc. The interconnect clip 100 includes three lateral regions, namely a die contact portion 102, a bridge portion 104, and a lead contact portion 106.

The die contact portion 102 is designed to interface with a conductive terminal of a semiconductor die (e.g., a bond pad) and form an electrical connection thereto. The die contact portion 102 includes upper and lower surfaces 108, 110 that are opposite from one another. According to an embodiment, the upper and lower surfaces 108, 110 of the die contact portion 102 are substantially planar surfaces that are parallel to one another.

The bridge portion 104 adjoins the die contact portion 102. The bridge portion 104 is designed to span across a lateral gap between a semiconductor die and a package lead within a semiconductor package. The die contact portion 102 includes upper and lower surfaces 112, 114 that are opposite from one another. According to an embodiment, the upper and lower surfaces 112, 114 of the bridge portion 104 are substantially planar surfaces that are parallel to one another.

The lower surface 114 of the bridge portion 104 is vertically offset from the lower surface of the die contact portion 102. To this end, the interconnect clip 100 includes a first transition surface 116 that defines a lateral transition between the die contact portion 102 and the bridge portion 104. The first transition surface 116 extends transversely from the lower surface 114 of the bridge portion 104. This means that the first transition surface 116 extends in a different direction as the lower surface 114 of the bridge portion 104 and intersects with the lower surface 114 of the bridge portion 104 at a defined inflection point. The first transition surface 116 extends to the lower surface of the of the lead contact portion 106. In the depicted embodiment, the first transition surface 116 is oriented perpendicularly relative to the lower surfaces 114, 110 of the bridge portion 104 and the die contact portion 102. Thus, the lower surface profile of the interconnect clip 100 has a step-shaped transition between the bridge portion 104 and the die contact portion 102. More generally, the first transition surface 116 may form an oblique angle with one or both of the lower surfaces 114, 110 of the bridge portion 104 and the die contact portion 102. Additionally or alternatively, the first transition surface 116 may be at least partially curved.

The lead contact portion 106 adjoins the bridge portion 104. The lead contact portion 106 is configured to effectuate electrical contact with a package lead. The lead contact portion 106 includes first and second lower surfaces 118, 120 that form an angled intersection with one another at a contact point 122. This means that the first and second lower surfaces 118, 120 of the lead contact portion 106 extend in different directions, and the contact point 122 is an inflection point between the two surfaces 118, 120. According to an embodiment, the first and second lower surfaces 118, 120 are planar surfaces that are substantially perpendicular to one another. More generally, the first and second lower surfaces 118, 120 may form an oblique angle with one another, and the contact point 122 may correspond to any angular transition between these two surfaces. The lead contact portion 106 additionally includes a first upper surface 124 that is opposite from the first lower surface 118 of the lead contact portion 106. According to an embodiment, the first upper surface 124 is a substantially planar surface that is parallel to the first lower surface of the lead contact portion 106.

The interconnect clip 100 includes a second transition surface 126 that defines a lateral transition between the bridge portion 104 and the lead contact portion 106. The second transition surface 126 extends transversely from the lower surface 114 of the bridge portion 104. This means that the second transition surface 126 extends in a different direction as the lower surface 114 of the bridge portion 104 and intersects with the lower surface 114 of the bridge portion 104 at a defined inflection point. In the depicted embodiment, the second transition surface 126 is oriented perpendicularly relative to the lower surface 114 of the bridge portion 104 and forms an oblique angle with the first lower surface 118 of the lead contact portion 106. Alternatively, the second transition surface 126 and the first lower surface 118 of the lead contact portion 106 may be parts of a continuous planar surface that is tilted relative to the lower surface 114 of the bridge portion 104, and extends from the lower surface 114 of the bridge portion 104 to the contact point 122. Additionally or alternatively, the second transition surface 126 may be at least partially curved.

The vertical offset of the lower surface 114 of the bridge portion 104 relative to the lower surface 110 of the die contact portion 102 can be defined with respect to planes that these two surfaces extend along. The lowermost planar surface of the die contact portion 102 defines a first plane 128. The lowermost planar surface of the bridge portion 104 is defined by a second plane 130 that is above the first plane 128. In the depicted embodiment, the lower surface 110 of the die contact portion 102 extends exclusively along the first plane 128 and the lower surface 114 of the bridge portion 104 extends exclusively along the second plane 130. In other embodiments, the lower surface 110 of the die contact portion 102 and/or the lower surface 114 of the bridge portion 104 may deviate upward from these planes. For example, the bridge portion 104 may include notches that deflect upward from the second plane 130. Moreover, in the depicted embodiment, the second plane 130 is substantially parallel to the first plane 128. In other embodiments, the second plane 130 may be tilted relative to the first plane 128, provided that the lower surface 114 of the bridge portion 104 does not traverse the first plane 128.

According to an embodiment, the lower surface 114 of the bridge portion 104 extends from the first transition surface 116 to the second transition surface 126 on or above a second plane 130 that is completely above the first plane 128. This means that the entire lower surface 114 of the bridge portion 104 remains above the lowermost surface of the die contact portion 102.

According to an embodiment, at least in one cross-sectional plane, the bridge portion 104 maintains a substantially uniform thickness throughout a length of the bridge portion 104. The length of the bridge portion 104 spans from the first transition surface 116 to the second transition surface 126. The thickness of the bridge portion 104 is a shortest distance between the upper and lower surfaces 112, 114 of the bridge portion 104 in the cross-section of interest. In the cross-sectional plane shown in FIG. 1, the bridge portion 104 has a uniform thickness throughout the length of the bridge portion 104. In another cross-sectional plane that is parallel to the cross-section plane of FIG. 1, depressions (not shown) may be formed in the upper surface 112 of the bridge portion 104. These depressions may be used to enhance adhesion with an encapsulant material. These depressions do not necessarily span the complete length of the bridge portion 104 and may be disposed on either side of a central cross-sectional span of the bridge portion 104 which has the uniform thickness.

According to an embodiment, the first lower surface 118 of the lead contact portion 106 is tilted relative to the first plane 128. This means that the first lower surface 118 of the lead contact portion 106 is oriented at an oblique angle, i.e., a non-perpendicular and non-parallel angle, relative to the first plane 128. Similarly, the second lower surface 120 of the lead contact portion 106 may be titled relative to the first plane 128. For example, the first and second lower surfaces 118, 120 of the lead contact portion 106 may each be oriented at an angle of between 150 and 130 degrees, relative to the first plane 128.

In the depicted embodiment, the contact point 122 is below the first plane 128. As a result, the interconnect clip 100 has a so-called downset configuration wherein the interconnect clip 100 is configured to effectuate electrical contact at a location that is vertically below the lower surface 110 of the die contact portion 102.

According to an embodiment, a thickness of the die contact portion 102 is between 200 μm and 600 μm. In a first specific example, the thickness of the die contact portion 102 is about 250 μm. In a second specific example, the thickness of the die contact portion 102 is about 380 μm. In a third specific example, the thickness of the die contact portion 102 is about 510 μm. The thickness of the die contact portion 102 is a shortest distance between the upper and lower surfaces 108, 110 of the die contact portion 102.

According to an embodiment, a vertical offset of the lower surface 114 of the bridge portion 104 relative to the lower surface 110 of the die contact portion 102 is between 5 μm and 200 μm, and more particularly may be between 20 μm and 150 μm. Generally speaking, the selection of the vertical offset may dependent on the properties of the encapsulant material of the package, such as size and granularity of particles. In one specific example, this vertical offset is about 100 μm. The vertical offset of the lower surface 114 of the bridge portion 104 relative to the lower surface 110 of the die contact portion 102 is a shortest distance between the lower surface 114 of the bridge portion 104 and the first plane 128. The vertical offset of the lower surface 114 of the bridge portion 104 relative to the lower surface 110 of the die contact portion 102 may be independent from the thickness of the die contact portion 102 and/or the bridge portion 104. Hence, using a vertical offset of 100 μm, the thickness of the bridge portion 104 may be about 150 μm in the first specific example described above; about 280 μm in the second specific example described above; and about 410 μm in the third specific example described above.

According to an embodiment, a ratio between the thickness of the bridge portion 104 and the thickness of the die contact portion 102 is between 0.5 and 0.9. In the first specific example described above, this ratio is about 0.6. In the second specific example described above, this ratio is about 0.74. In the third specific example described above, this ratio is about 0.8.

According to an embodiment, a first thickness of the lead contact portion 106 is substantially equal to the thickness of the bridge portion 104. Hence, in the first specific example described above, the thickness of the lead contact portion 106 may be about 150 μm; in the second specific example described above, the thickness of the lead contact portion 106 may be about 280 μm; and in the third specific example described above, the thickness of the lead contact portion 106 may be about 410 μm. The first thickness of the lead contact portion 106 is a shortest distance between the first upper surface 124 and the first lower surface 118 of the lead contact portion 106.

The above discussed geometric parameters of the interconnect clip 100 are representative of specific embodiments. More generally, the size, shape, and proportional relationships of the above discussed features of the interconnect clip 100 may be suitably adapted to meet a variety of different application requirements. Examples of these application requirements include semiconductor die size, semiconductor load current, and package size, to name a few.

Figure 2:
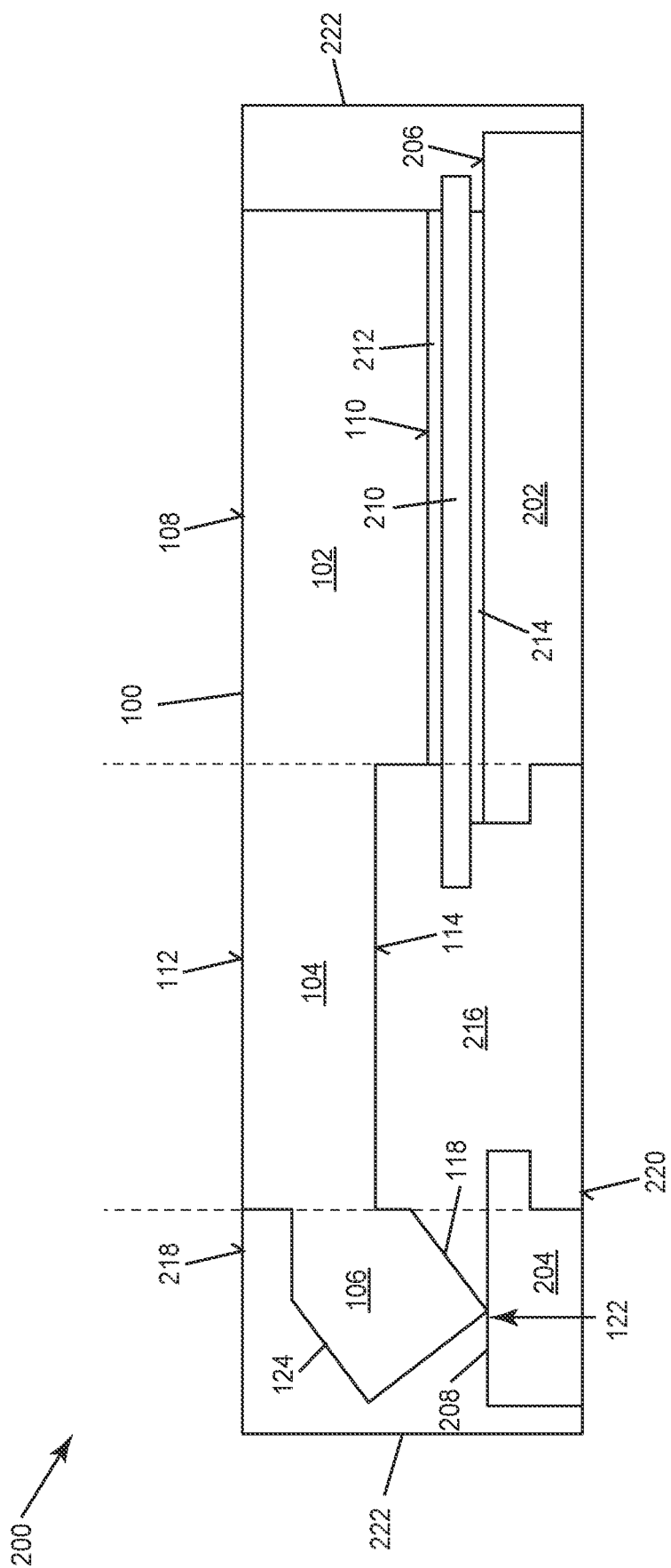
FIG. 2 depicts a semiconductor package assembly, according to an embodiment.

Referring to FIG. 2, a semiconductor package assembly 200 is depicted, according to an embodiment. The semiconductor package assembly 200 includes a die pad 202 and a lead 204. The die pad 202 and the lead 204 are electrically conductive structures. Exemplary materials of the die pad 202 and the lead 204 include metals such as copper, aluminum, nickel, iron, zinc, etc., and alloys thereof. The die pad 202 and the lead 204 can be part of a common lead frame structure. The die pad 202 includes a die attach surface 206, which is a substantially planar surface configured for the mounting of a semiconductor die thereon. The lead 204 is spaced apart from the die pad 202 and includes a contact pad 208. The contact pad 208 is a substantially planar surface that is configured to accommodate an electrical connection with an interconnect feature, e.g., bond wire, clip, ribbon, etc.

The semiconductor package assembly 200 includes a semiconductor die 210. Generally speaking, the semiconductor die 210 can have a wide variety of device configurations. These configurations include discrete device configurations such as a MOSFET (Metal Oxide Semiconductor Field Effect Transistor), an IGBT (Insulated Gate Bipolar Transistor), a JFET (Junction Field Effect Transistor), a diode, etc. These configurations additionally may include integrated circuit configurations such as amplifiers, controllers, processors, etc. Generally speaking, the semiconductor die 210 may include any of a wide variety of semiconductor materials. These semiconductor materials include type IV semiconductors, e.g., silicon, silicon germanium, silicon carbide, etc., and type Ill-V semiconductors, e.g., gallium nitride, gallium arsenide, etc. The semiconductor die 210 may be configured as a vertical device that is configured to control a current flowing between opposite facing upper and lower surfaces, or a lateral device that is configured to control a current flowing parallel to a main upper surface.

The semiconductor die 210 is mounted on the die attach surface 206. An adhesive, e.g., solder, sinter, conductive glue, tape, etc., may be provided between a lower surface of the semiconductor die 210 and the die attach surface 206 to effectuate this connection.

According to an embodiment, the semiconductor die 210 includes a first terminal 212 disposed on an upper surface of the semiconductor die 210 that faces away from the die attach surface 206. The first terminal 212 may be an electrically conductive bond pad. The semiconductor die 210 may additionally includes a second terminal 214 disposed on a lower surface of the semiconductor die 210 that faces the die attach surface 206. The second terminal 214 may be an electrically conductive bond pad. According to an embodiment, the first and second terminals 212, 214 are the load terminals of the semiconductor die 210. For example, the first and second terminals 212, 214 may be anode and cathode terminals in the case of a diode, or source/drain terminals in the case of a MOSFET, or collector/emitter terminals in the case of an IGBT. The second terminal 214 may be electrically connected to the die pad 202, via solder or sinter, for example.

The semiconductor package assembly 200 includes an encapsulant body 216. The encapsulant body 216 includes an upper surface 218, a lower surface 220, and side surfaces 222 that extend between the upper and lower surfaces 216, 218 of the encapsulant body 216. The encapsulant body 216 forms an insulative and protective structure around the semiconductor die 210, the die pad 202, the lead 204, and the interconnect clip 100. The encapsulant body 216 includes an electrically insulating material. Examples of these materials include ceramics, epoxy materials, thermosetting plastics, to name a few. The encapsulant body 216 can be formed using a molding technique such as injection molding, compression molding, transfer molding, etc.

According to an embodiment, an upper side of the interconnect clip 100 is exposed from the encapsulant body 216. More particularly, the upper surfaces 108, 112 of the die contact portion 102 and the bridge portion 104 may be exposed from and coplanar with the upper surface 216 of the encapsulant body 216. This configuration allows the interconnect clip 100 to serve a dual function as both an interconnect feature and a heat dissipation feature. An external heat sink (not shown) may be mounted on top of the exposed portion of the interconnect clip 100. In this configuration, the die contact portion 102 acts as a heat slug.

In the semiconductor package assembly 200, the interconnect clip 100 provides an electrical connection between the first terminal 212 of the semiconductor die 210 and the lead 204. To this end, the lower surface 218 of the die contact portion 102 is flush against the upper surface 216 of the semiconductor die 210 and is electrically connected to the first terminal 212. The contact point 122 of the lead contact portion is in electrical contact with the contact pad 208 of the lead 104. Each of these electrical connections may be effectuated by direct surface to surface contact between the connected elements or by a conductive intermediary. According to an embodiment, the contact point 122 is mechanically coupled to the planar contact pad 208. This means that a stable bond is formed between the two surfaces, e.g., from a malleable adhesive such as solder, sinter, etc.

According to an embodiment, the interconnect clip 100 is mounted such that the first and second lower surfaces 118, 120 of the lead contact portion 106 are tilted relative to the contact pad 208. This means that each of the first and second lower surfaces 118, 120 form an obtuse angle with the planar contact pad 208. In one specific example, the first lower surface 218 forms an angle of between about 30 and 45 degrees with the contact pad 208, and the second lower surface 218 forms an angle of between about 30 and 45 degrees with the contact pad 208.

According to an embodiment, the interconnect clip 100 is mounted such that the lower surface 114 of the bridge portion 104 extends along a single plane which is above the upper surface of the semiconductor die 210. Moreover, the lower surface 114 of the bridge portion 104 remains on this single plane from directly over the semiconductor die 210 to directly over the lead 204. This is made possible by the lower surface profile of the interconnect clip 100, wherein the lower surface 114 of the bridge portion 104 extends along the second plane 130 and the lower surface 110 of the die contact portion 102 extends along the first plane 128, as previously discussed. Specifically, the intersection between the first transition surface 116 and the lower surface 114 of the bridge portion 104 occurs at a first location that is directly above the die pad 202, and the intersection between the second transition surface 126 and the lower surface 114 of the bridge portion 104 occurs at a second location that is directly above the contact pad 208.

According to an embodiment, the contacting interfaces of the interconnect clip 100 are vertically offset from one another. Specifically, the die contact portion 102 contacts the upper surface of the semiconductor die 210 at a location that is vertically above the location that the lead contact portion 106 contacts the contact pad 208. This vertical displacement may be in the range of 150 µm and 200 µm, for example. In a specific example, the vertical displacement is about 175 µm. More generally, this vertical displacement can be suitably adapted to meet a variety of design considerations such as, thickness of the semiconductor die, thickness of solder/sinter, etc.

Due to the lower surface profile of the interconnect clip 100 within the assembly, the semiconductor die 210 can advantageously be located closer to the side surface 222 of the encapsulant body 216, which in turn increases the die size to package size ratio. As is generally understood in the art, design rules account for normal variation in feature size, e.g., clip length by imposing minimum separation distances between elements. One such design rule requires a lateral spacing between the edge of a semiconductor die and a side surface of the interconnect clip which reaches or crosses the plane of the semiconductor die. Known clip configurations include side surfaces that reach the plane of the semiconductor die at a location that is between the die pad and the lead. Hence, these side surfaces dictate the allowable boundary of the semiconductor die. By contrast, in the presently disclosed configuration, the nearest surface that crosses the plane of the semiconductor die (i.e., the second transition surface 126 or the first lower surface 118) is disposed directly over the lead. As a result, the edge of the semiconductor die 210 can encroach closer to the edge of the package.

Illustrating the above described concept, according to an embodiment, a lateral edge side of the semiconductor die 210 extends past an edge side of the die pad 202 and is disposed directly below the lower surface 114 of the bridge portion 104. In the above described known clip configurations wherein side surfaces of the clip reach the plane of the semiconductor die at a location that is between the die pad and the lead, this arrangement would not be possible due to minimum spacing requirements.

Meanwhile, the thickness of the interconnect clip 100 is advantageously maintained high throughout the conduction path of the clip. As previously explained, the bridge portion 104 and the lead contact portion 106 may have the same thickness, which may be a significant majority of the thickness of the die contact portion 102, e.g., at least 60% of the thickness of the die contact portion 102. As a result, the interconnect clip 100 lacks any bottleneck points that detrimentally increase resistance, and consequently increase power consumption. Moreover, these ratios are achieved with a relatively thick die contact portion 102, e.g., at least 175 µm thick, which allows for efficient heat extraction via a top-side mounted heat sink.

Figure 3:
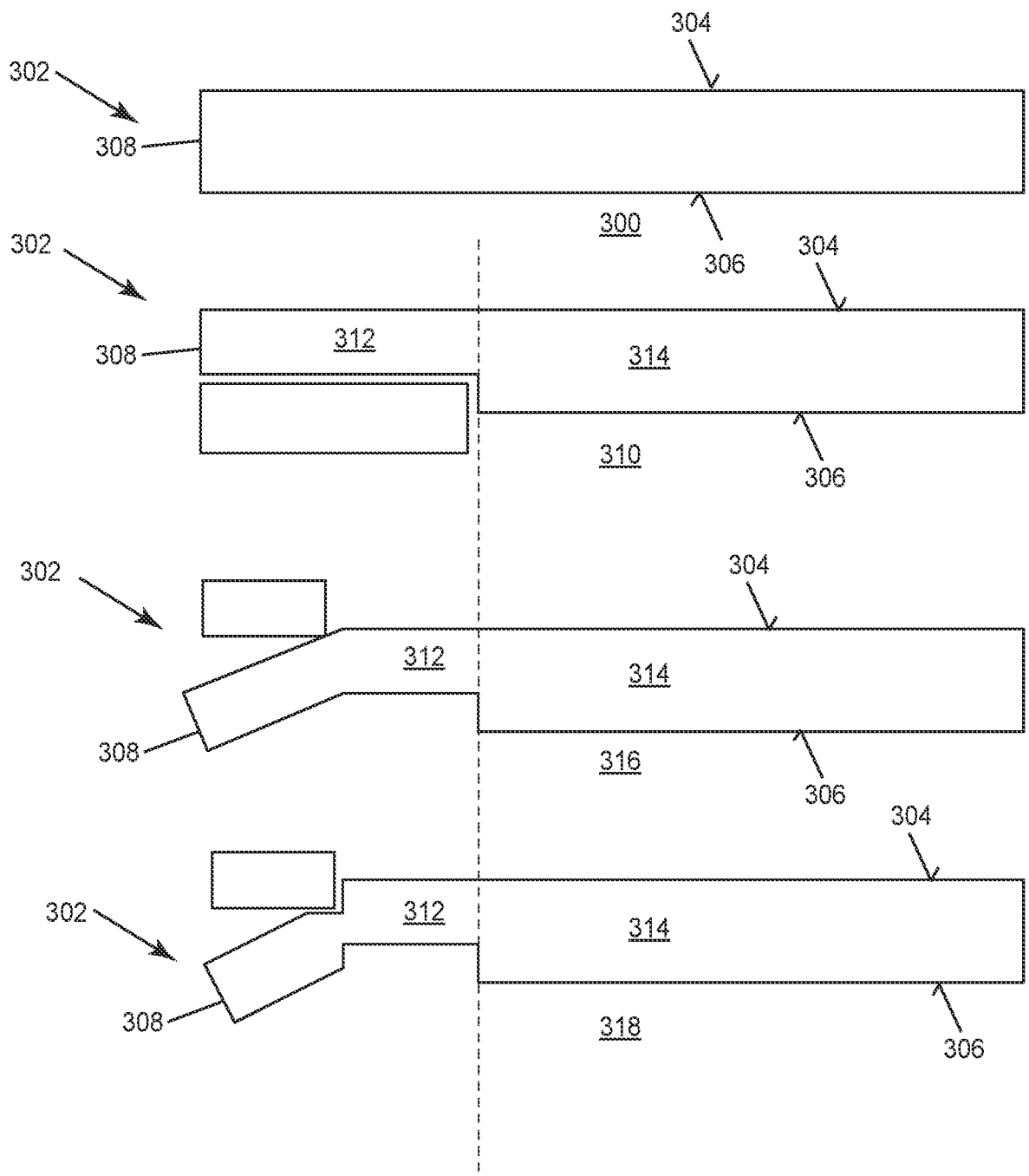
FIG. 3 depicts a method of forming an interconnect clip, according to an embodiment.

Referring to FIG. 3, a method of forming the interconnect clip 100 is described, according to an embodiment.

In a first process step 300 of the method, a planar sheet metal 302 is provided. The planar sheet metal 302 can include conductive metals such as copper, aluminum, etc., and alloys thereof. The planar sheet metal 302 includes a substantially planar upper surface 304, a substantially planar lower surface 306, and an edge surface 308 that extends between the upper and lower surfaces 304, 306 of the planar sheet metal 302. The edge surface 308 of the planar sheet metal 302 may be substantially perpendicular to the upper and lower surfaces 304, 306 of the planar sheet metal 302.

In a second process step 310 of the method, the lower surface 306 of the planar sheet metal 302 is punched, e.g., by a coining technique. This forms a punched region 312 of the planar sheet metal 302 that is thinner than an unpunched region 314. The difference in thickness between the punched region 312 and the unpunched region 314 may correspond to the vertical offset of the bridge portion 104, e.g., between 5 and 15 µm in an embodiment. Punching the lower surface 306 of the planar sheet metal 302 forms the lower surface profile of the the die contact portion 102, the bridge portion 104 and the first transition surface 116, as previously discussed. The upper and lower surfaces 304, 306 of the planar sheet metal 302 in the unpunched region 314 correspond to the upper and lower surfaces 108, 110 of the die contact portion 102. The upper and lower surfaces 304, 306 of the planar sheet metal 302 in the punched region 312 correspond to the upper and lower surfaces 112, 114 of the bridge portion 104.

In a third process step 316 of the method, the planar sheet metal 302 is bent downward. This may be done by applying a machine tool to the upper surface 304 of planar sheet metal 302 in the punched region 312. This bends the planar sheet metal 302 such that the lower surface 306 of the sheet metal 302 is tilted. The tilted surface corresponds to the first lower surface 118 of the lead contact portion 106. The edge surface 308, which is also tilted after the bending step, corresponds to the second lower surface 120 of the lead contact portion 106. The bending can be performed such that these surfaces extend along the previously discussed tilt angles, e.g., between 130 degrees and 150 degrees relative to the first plane 128 in an embodiment.

In a fourth process step 318 of the method, the planar sheet metal 302 is vertically displaced downward in an end section of the punched region 312. This may be done by applying a sharp-edged machine tool to the upper surface 216 of the sheet metal in the punched region 312. The sharp-edged machine tool may be a tool that is used for cutting sheet metal for example. This technique is performed to offset the lead contact portion 106 until the contact point 122 reaches the desired vertical displacement below the first plane 128, e.g., between and 150 µm and 200 µm in the above discussed example.

Advantageously, the process sequence described with reference to FIG. 3 enables the formation of the interconnect clip 100 with a desired vertical displacement of the contact point 122 (e.g., between and 150 µm and 200 µm) while simultaneously forming the contacting interface of the interconnect clip 100 with a narrow profile. While it is technically possible to achieve similar vertical displacement by performing only a bending step similar to the third process step 316 or by performing only a half-cutting/displacement step similar to the fourth process step 318, either one of these approaches suffers from drawbacks. Specifically, performing only a bending step rotates the edge of the planar sheet metal closer to parallel with the lower surface of the sheet metal. Alternatively, a half-cutting/displacement step requires significant overlap between the edge of the planar sheet metal and the machine tool. In either case, the result is that the contacting interface of the interconnect clip is relatively wide, e.g., at least as wide as the thickness of the sheet metal. By performing the two steps together, the necessary vertical displacement can be achieved while tilting the contact surfaces including the first lower surface of the lead contact portion 106. The resultant narrow profile of the contacting interface of the interconnect clip 100 may generally be desirable because it enables smaller sized contact pads, which in turn can enable a reduction in package size.

Figure 4:
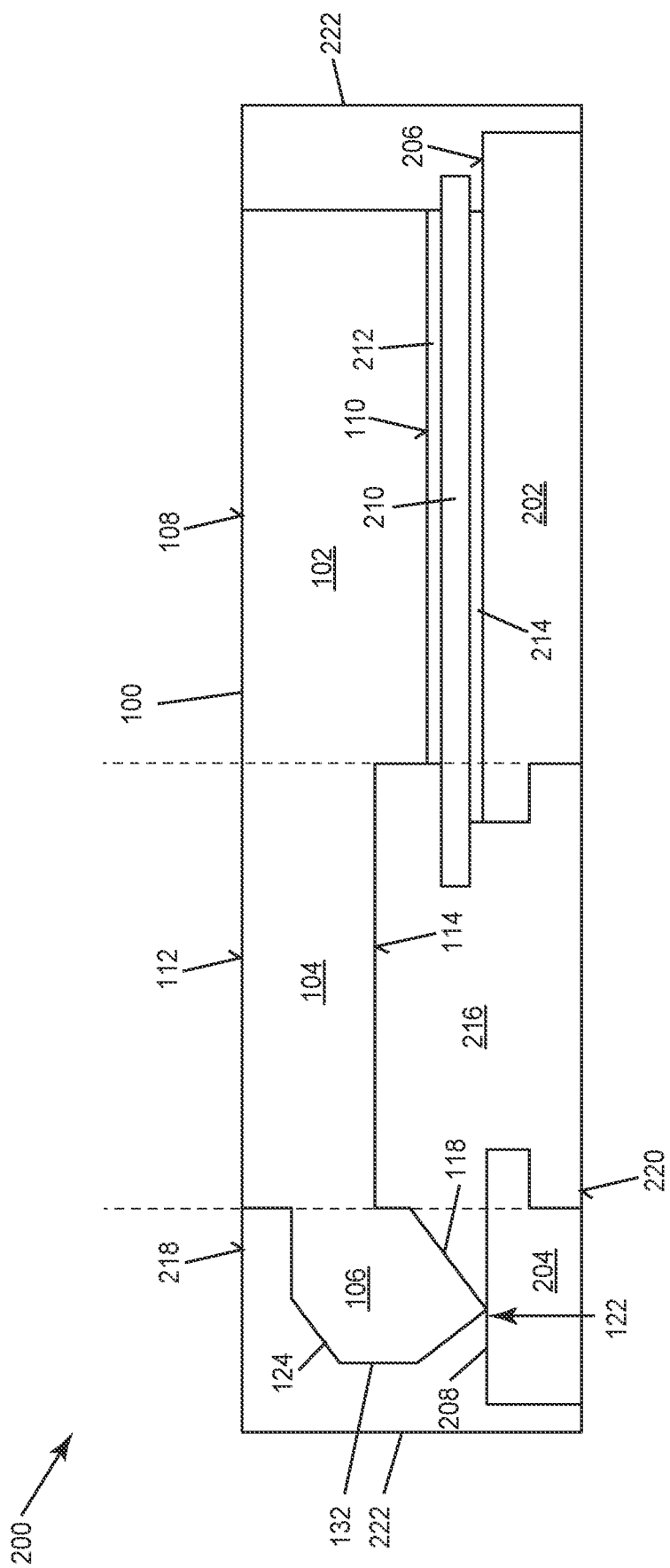
FIG. 4 depicts a semiconductor package assembly, according to an embodiment.

Referring to FIG. 4, a semiconductor package assembly 200 is depicted, according to another embodiment. The embodiment of FIG. 4 is identical to the embodiment described with reference to FIG. 2 in all respects, except that the interconnect clip 100 has a different upper surface profile. More particularly, the lead contact portion 106 further includes a second substantially planar upper surface 132 that forms an angled intersection with the first upper surface 124 of the lead contact portion 106. The second upper surface 132 of the lead contact portion 106 is tilted towards the plane of the second lower surface 120 of the lead contact portion 106. According to one embodiment, the second upper surface 132 of the lead contact portion 106 is parallel or close to parallel with the side surface of the encapsulant body 216, i.e., within about +/–10 degrees to parallel with the side surface 222 of the encapsulant body 216. One advantage of this configuration a reduction in package size by reducing the lateral encroachment of the interconnect clip 100 towards the side surface 222 of the encapsulant body 216.

Figure 5:
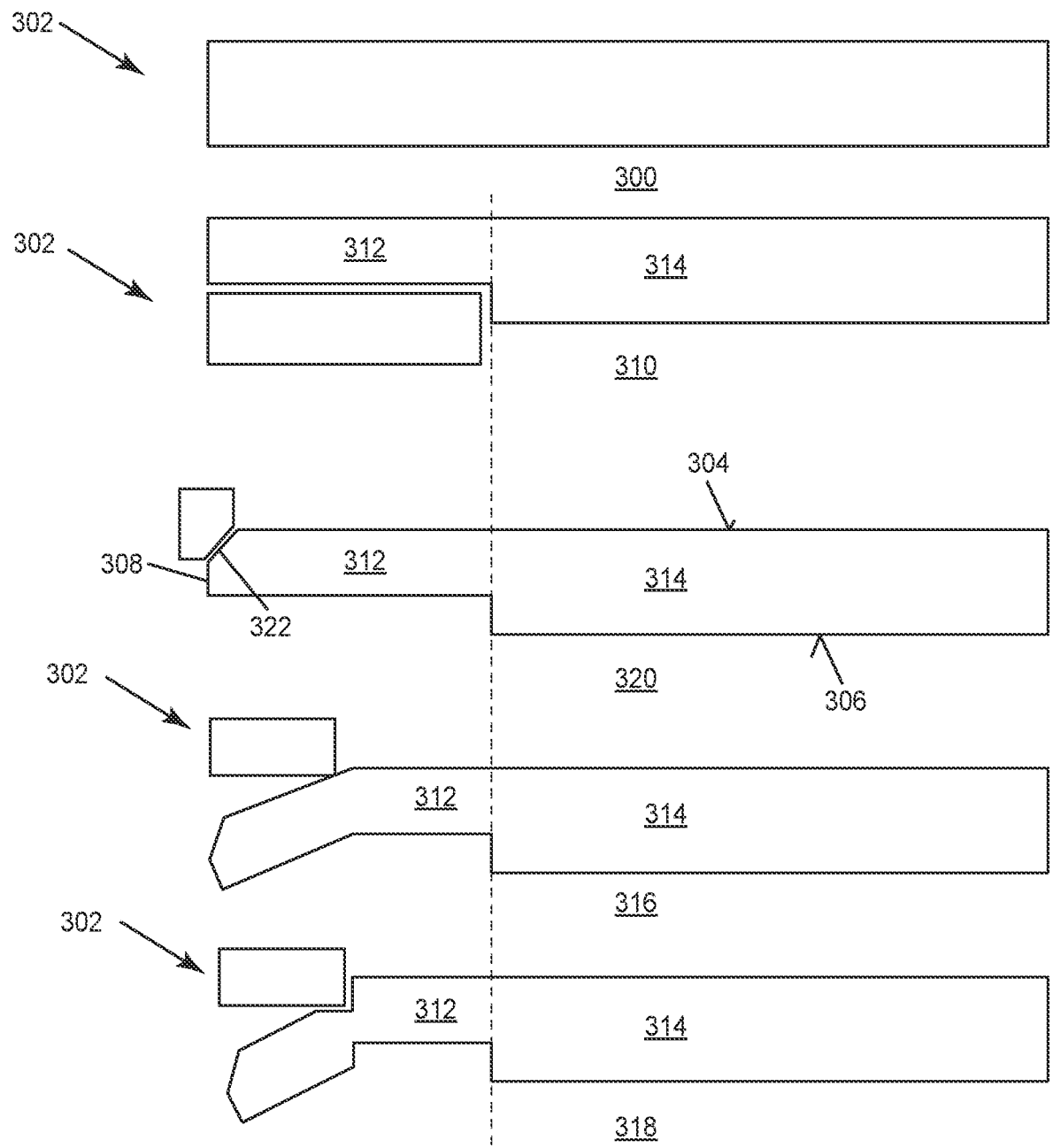
FIG. 5 depicts a method of forming an interconnect clip, according to an embodiment.

Referring to FIG. 5, a method of forming the interconnect clip 100 in the assembly of FIG. 4 is depicted, according to an embodiment. The method includes performing the first, second, third and fourth process steps 300, 310, 316 and 318 according to the same techniques as described with reference to FIG. 3. Additionally, the method includes performing a fifth process step 320 after the second process step 310 and before the third process step 316. The fifth process step 320 includes forming a first chamfer 322 in the punched region 312. The first chamfer 322 may be formed by a punching process, for example. The first chamfer 322 is formed to extend between the upper surface 304 of the sheet metal 302 and the edge surface 308 of the sheet metal 302. The first chamfer 322 corresponds to the second upper surface 216 of the lead contact portion 106 as previously described. The chamfering process may be controlled so that the first chamfer 322 is angled appropriately, e.g., perpendicular to the lower surface 218 of the die contact portion 102 after the bending and offsetting is complete.

Figure 6:
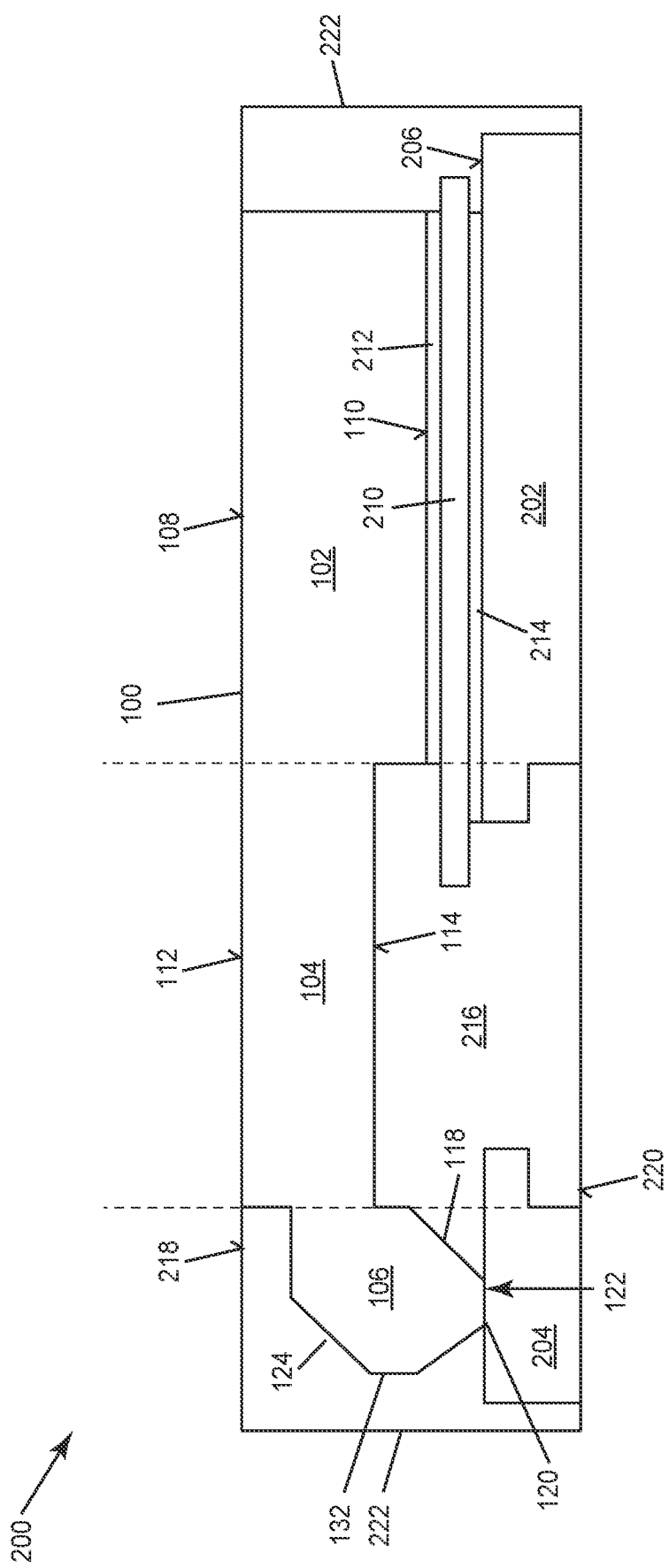
FIG. 6 depicts a semiconductor package assembly, according to an embodiment.

Referring to FIG. 6, a semiconductor package assembly 200 is depicted, according to another embodiment. This embodiment of FIG. 6 is identical to the embodiment described with reference to FIG. 4 in all respects, except that the interconnect clip 100 has a different lower surface profile. More particularly, the lead contact portion 106 is modified so that the second lower surface 120 of the lead contact portion 106 is substantially parallel to and flush against the contact pad 208 when the interconnect clip 100 is mounted. Hence, different to the previously described embodiments, only the first lower surface 118 of the lead contact portion 106 is titled relative to the first plane 128 and relative to the contact pad 208. One advantage of this configuration is an enhanced surface area contact between the interconnect clip 100 and the lead 204. Although a narrow contact interface is generally desirable for the reasons previously explained, narrowing the contact interface disadvantageously increases contact resistance. The design shown in FIG. 6 provides a larger cross-sectional contact area for current flow. Nevertheless, the length of the second lower surface 120 of the lead contact portion 106 may be tailored to be sufficiently small (e.g., less than 50% of thickness of the lead contact portion 106) so as to not implicate the size of the lead 204 by requiring a larger contact pad.

Figure 7:
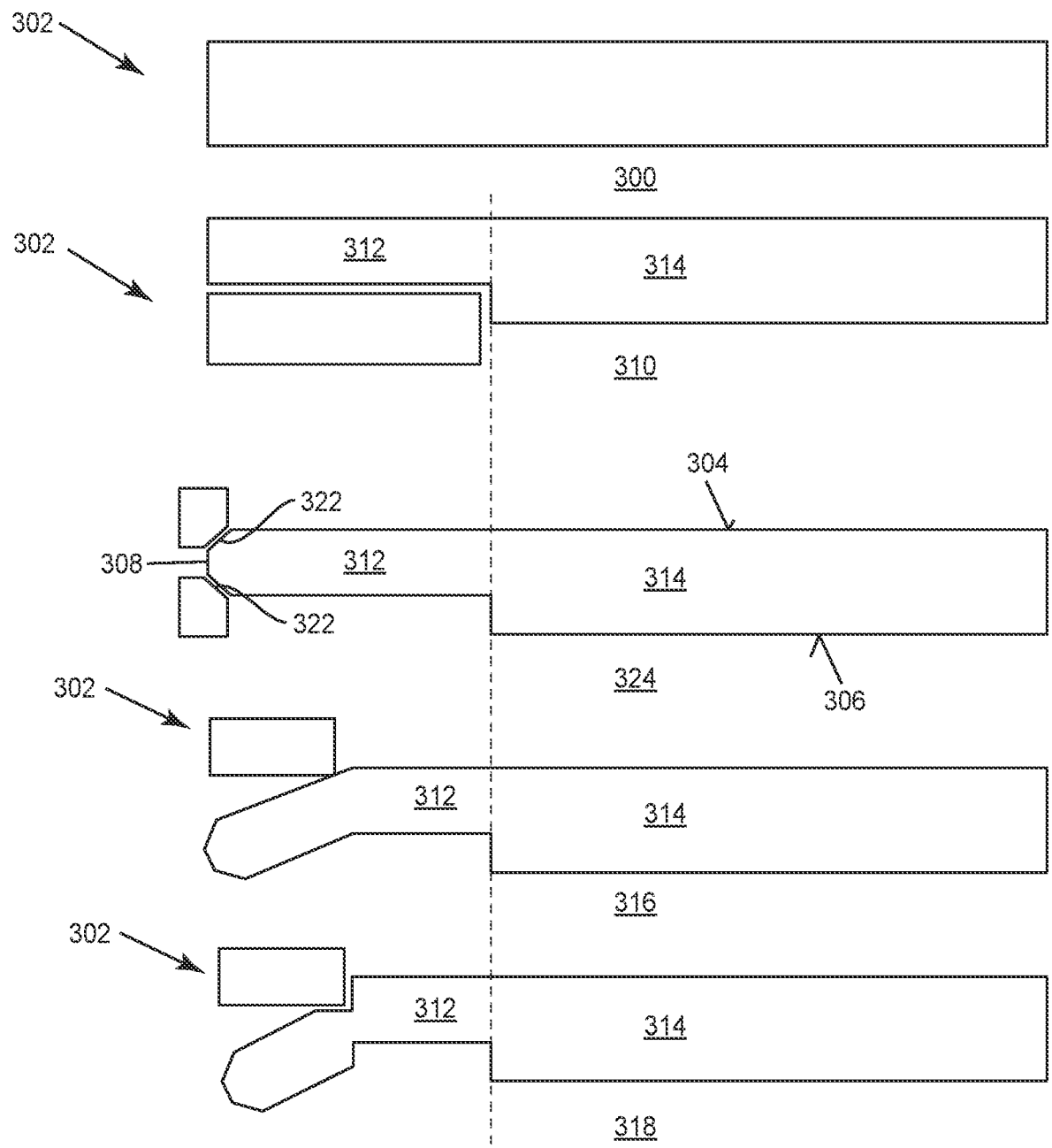
FIG. 7 depicts a method of forming an interconnect clip, according to an embodiment.

Referring to FIG. 7, a method of forming the interconnect clip 100 in the assembly of FIG. 6 is depicted, according to an embodiment. The method includes performing the first, second, third and fourth process steps 300, 310, 316 and 318 according to the same techniques as described with reference to FIG. 3. Additionally, the method include performing a sixth process step 324 after the second process step 310 and before the third process step 316. The sixth process step 324 includes forming the first chamfer 322 in the lead contact portion 106 in the manner previously described. Additionally, the sixth process step 324 includes forming a second chamfer 326 in the lead contact portion 106. The second chamfer 326 may be formed by a punching process, for example. The first chamfer 322 is formed to extend between the lower surface 306 of the sheet metal 302 and the edge surface 308 of the sheet metal 302. The second chamfer 236 correlates to the second lower surface 120 of the lead contact portion 106 as previously described. The chamfering process may be controlled so that this surface is angled appropriately, e.g., parallel to the lower surface 110 of the die contact portion 102 after the bending and offsetting is complete.

Figure 8:
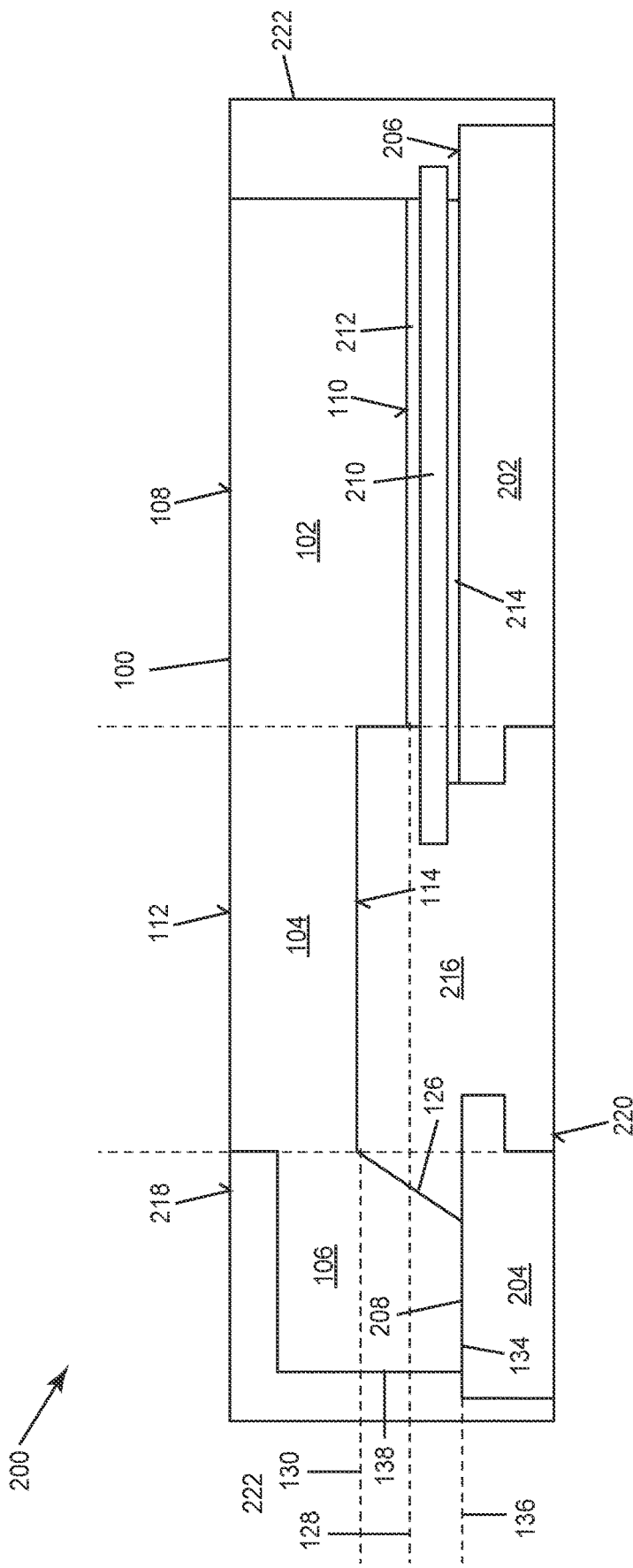
FIG. 8 depicts a semiconductor package assembly, according to an embodiment.

Referring to FIG. 8, a semiconductor package assembly 200 is depicted, according to another embodiment. The semiconductor package assembly 200 of FIG. 8 is identical to the previously described embodiments, except that the lead contact portion 106 of the interconnect clip 100 has a different geometry that will be described in further detail below.

The lead contact portion 106 of the interconnect clip 100 includes a lead contact surface 134. The lead contact surface 134 can be a substantially planar surface that is in electrical contact with the contact pad 208 of the lead 204 when the interconnect clip 100 is mounted. The lead contact surface 134 can be level with the contact pad 208 with an intermediary material, e.g., solder or other conductive adhesive, disposed between. In the depicted embodiment, the lead contact surface 134 extends along a third plane 136 that is completely below the first plane 128 and corresponds to an interface plane with the contact pad 208. In another embodiment, the third plane 136 can be parallel to the first plane 128. More generally, the lead contact surface 134 can extend along any plane that enables electrical contact with a planar contact surface in a semiconductor package.

In contrast to the embodiment of FIG. 4 wherein only the contact point 122 acutely contacts the contact pad 208 of the lead 204, the interconnect clip 100 of FIG. 8 has a larger surface area for electrical contact between the interconnect clip 100 and the contact pad 208, which leads to reduced contact resistance. The lead contact surface 134 may be mechanically coupled and electrically connected to the contact pad 208 using any of the previously described techniques, e.g., using a malleable adhesive such as solder, sinter, etc.

According to an embodiment, the lead contact surface 134 extends completely to reach an outer end surface 138 of the interconnect clip 100. The outer end surface 138 of the interconnect clip 100 is a surface that extends substantially in a transverse direction to the planar contact pad 208 in the mounted position. Different to the embodiment of FIG. 6 wherein the interconnect clip 100 includes multiple angled surfaces at its outer end, the interconnect clip 100 of FIG. 8 has only one outer end surface 138 that extends between the upper and lower surfaces of the lead contact portion 106. The outer end surface 138 of the interconnect clip 100 can be substantially perpendicular to the lead contact surface Additionally or alternatively, the outer end surface 138 of the interconnect clip 100 can be substantially parallel to the side surface 222 of the encapsulant body 216. This allows for minimum spacing between the outer end surface 138 of the interconnect clip 100 and the side surface 222 of the encapsulant body 216, thereby providing enhanced space efficiency in the semiconductor package assembly 200.

In the embodiment of FIG. 8, the interconnect clip 100 includes a second transition surface 126 that extends from the lower surface 134 of the bridge portion 104 to the lead contact surface 134. The second transition surface 126 is tilted relative to the lower surface 134 of the bridge portion 104, meaning that it forms a non-perpendicular angle (e.g., acute angle) with the lower surface 134 of the bridge portion 104. In the previous embodiments, the second transition surface 126 and the first lower surface 118 of the lead contact portion 106 are separate surfaces that are angled relative to another other. The interconnect clip of FIG. 8 instead includes only one continuous surface that extends along a single plane (referred to as the second transition surface 126 for ease of description). In another embodiment (not shown), the interconnect clip 100 may include a second transition surface 126 that is perpendicular to the lower surface 134 of the bridge portion 104 and a separate surface that is tilted relative to the lower surface 134 of the bridge portion 104 that extends to the lead contact surface 134.

Figure 9:
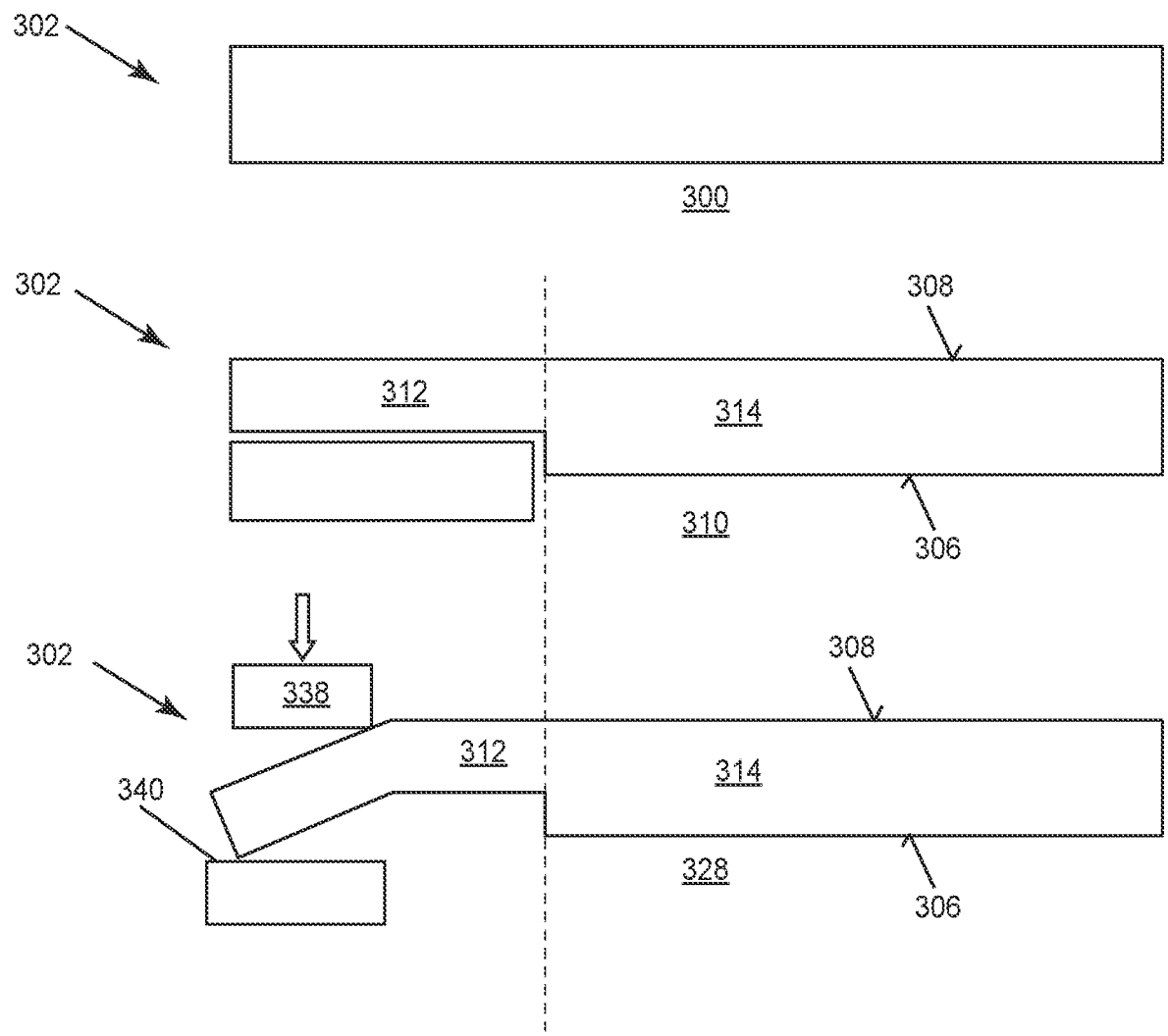
FIG. 9 and FIG. 10 depict a method of forming an interconnect clip, according to an embodiment.
Figure 10:
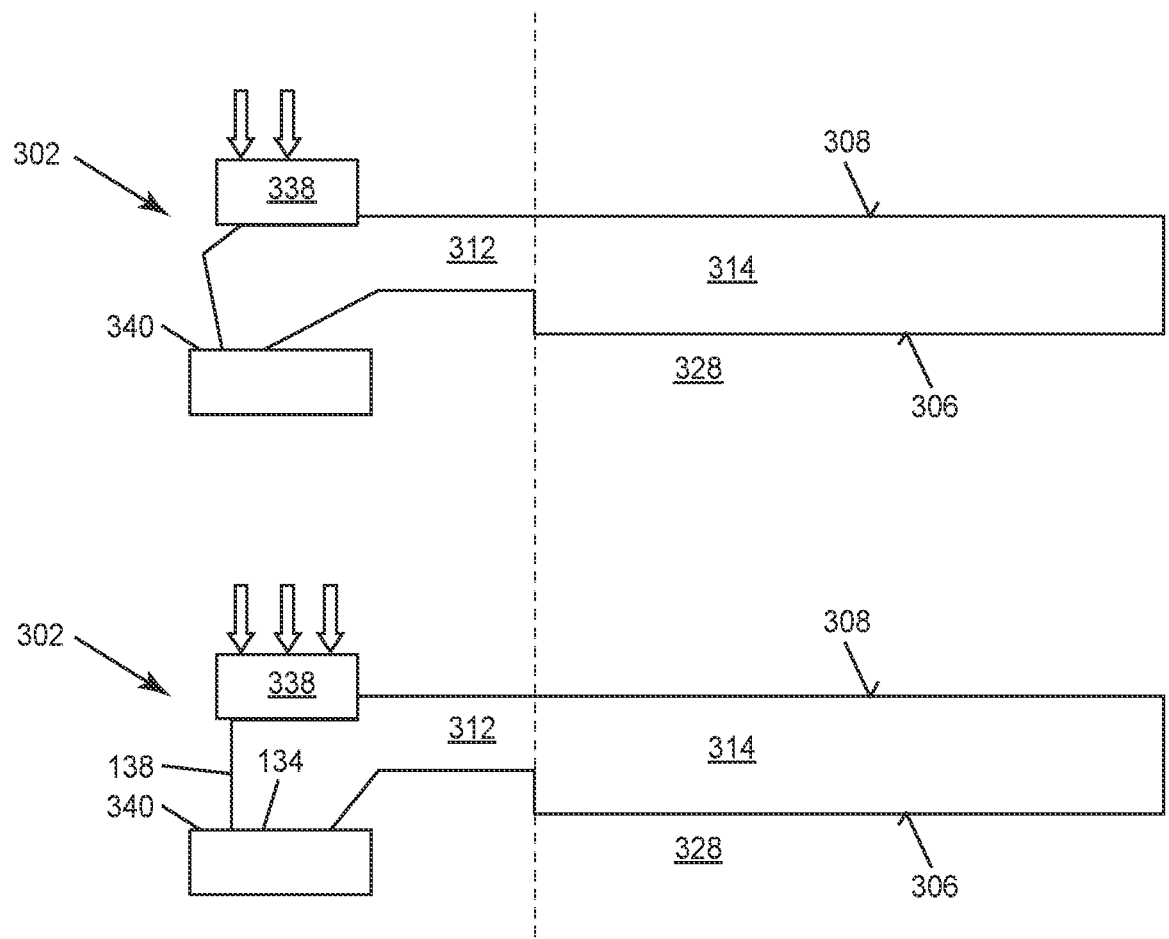

Referring to FIG. 9 and FIG. 10, a method of forming the interconnect clip 100 from the assembly 200 of FIG. 8 is depicted, according to an embodiment. According to this technique, first and second process steps 300, 310 are performed on a sheet metal. These first and second process steps 300, 310 can be performed according to the same techniques as described with reference to FIG. 3 thereby forming a punched region 312 and an unpunched region 314 from a planar sheet metal 302.

The method of FIG. 9 and FIG. 10 includes a performing third process step 328 after forming the punched region 312 and the unpunched region 314. The third process step 328 includes bending an outer portion of the punched region 312 by applying a machine tool 338 to the upper surface 308 of the sheet metal 302. This may be done in a similar or identical manner as the third process step 316 described with reference to FIG. 5, for example.

Different to the previously described techniques, the process step which bends the sheet metal 302 (i.e., the third process step 328) is performed with a planar pad 340 arranged beneath the punched region 312. The planar pad 340 is harder than the material of the interconnect clip 100 so that it does not deform by force applied from the sheet metal 302. The planar pad 340 thus forms the lead contact surface 134 by transforming the shape of the sheet metal 302 as it is pressed downward. The three illustrations of the third process step 328 represent the progressive transformation of the sheet metal 302 as the mechanical pressure is continuously applied to the upper surface 308 of the sheet metal 302. As can be appreciated from the depicted sequence, the planar pad 340 provides a counteracting force that maintains the lower surface 306 of the sheet metal 302 along the desired plane while the machine tool 338 applies force to the upper surface 308 of the sheet metal 302. This simultaneous bending and flattening can be performed until the lead contact surface 134 is formed in the desired size. A similar flattening effect may occur between the upper surface of the 308 of the sheet metal 302 and the machine tool 338 such that the completed lead contact portion 106 has parallel upper and lower surfaces that each extend to an outer end surface 138 of the interconnect clip 100.

The technique described with reference to FIG. 9 forms the interconnect clip 100 to have the bridge portion 104 and the lead contact portion 106 to have the advantageous geometry as previously described with minimal processing steps. In comparison to the technique described with reference to FIG. 7, the steps for forming the first and second chamfers 322, 326 can be omitted.

The term "substantially" as used herein encompasses absolute conformity with the specified requirement as well as minor deviations from absolute conformity with the requirement due to manufacturing process variations, assembly, and other factors that may cause a deviation from the design goal. Provided that the deviation is within process tolerances so as to achieve practical conformity and the components described herein are able to function according to the application requirements, the term "substantially" encompasses any of these deviations.

The term "electrically connected," "directly electrically connected" and the like as used herein describes a permanent low-impedance connection between electrically connected elements, for example a direct contact between the relevant elements or a low-impedance connection via a conductive intermediary, such as solder, sinter, etc.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An interconnect clip, comprising:
a die contact portion comprising opposing upper and lower surfaces;
a bridge portion adjoining the die contact portion and comprising opposing upper and lower surfaces;
a lead contact portion adjoining the bridge portion and comprising a lead contact surface or contact point; and
wherein the lower surface of the die contact portion extends along a first plane,
wherein the lower surface of the bridge portion is substantially planar extends along a second plane that is completely above the first plane throughout a complete length of the bridge portion.

2. The interconnect clip of claim 1, further comprising:
a first transition surface extending transversely from the lower surface of the bridge portion and reaching the lower surface of the die contact portion; and
a second transition surface extending transversely from the lower surface of the bridge portion and reaching the lead contact surface or contact point of the lead contact portion,
wherein the complete length of the bridge portion begins at the first transition surface and ends at the second transition surface.

3. The interconnect clip of claim 2, wherein a thickness of the bridge portion is substantially uniform throughout the complete length of the bridge portion, the thickness of the bridge portion being measured between the upper and lower surfaces of the bridge portion.

4. The interconnect clip of claim 1, wherein the lead contact portion comprises the lead contact surface, and wherein the lead contact surface is a substantially planar lower surface of the interconnect clip that extends along a third plane that is completely below the first plane.

5. The interconnect clip of claim 4, wherein the lead contact surface extends to an outer end surface of the interconnect clip that extends transversely to the lead contact surface.

6. The interconnect clip of claim 4, wherein the second transition surface is a continuous planar surface that is tilted relative to the lower surface of the bridge portion and extends from the lower surface of the bridge portion to the lead contact surface.

7. The interconnect clip of claim 1, wherein the lead contact surface or contact point is disposed below the first plane.

8. A semiconductor package assembly, comprising:
a die pad comprising a die attach surface;
an electrically conductive lead spaced apart from the die pad and comprising a substantially planar contact pad;
a semiconductor die mounted on the die pad and comprising a first terminal disposed on an upper surface of the semiconductor die, the upper surface of the semiconductor die facing away from the die attach surface; and
an interconnect clip electrically connecting the first terminal to the lead, the interconnect clip comprising:
a die contact portion comprising upper and lower surfaces;
a bridge portion adjoining the die contact portion and comprising upper and lower surfaces; and
a lead contact portion adjoining the bridge portion and comprising a lead contact surface or contact point;
wherein the lower surface of the die contact portion is flush against the upper surface of the semiconductor die,
wherein the lead contact surface or contact point is electrically connected to the contact pad,
wherein the lower surface of the die contact portion extends along a first plane that is parallel to the upper surface of the semiconductor die,
wherein the lower surface of the bridge portion extends from a first location to a second location along a second plane that is completely above the first plane,
wherein the first location is directly above the semiconductor die, and
wherein the second location is directly above the contact pad.

9. The semiconductor package assembly of claim 8, wherein a thickness of the bridge portion is substantially uniform throughout a length of the bridge portion, the length of the bridge portion spanning from the first location to the second location.

10. The semiconductor package assembly of claim 9, wherein the upper surface of the bridge portion is substantially coplanar with the upper surface of the die contact portion.

11. The semiconductor package assembly of claim 8, wherein the lead contact portion comprises the lead contact surface, and wherein the lead contact surface is flush against the contact pad.

12. The semiconductor package assembly of claim 11, wherein the lead contact surface extends to an outer end surface of the interconnect clip that extends transversely to the lead contact surface.

13. The semiconductor package assembly of claim 12, further comprising an electrically insulating encapsulant body that encapsulates the semiconductor die, wherein the encapsulant body comprises an upper surface, a lower surface, and a side surface extending between the upper and lower surfaces, and wherein the outer end surface of the interconnect clip is substantially parallel to the side surface of the encapsulant body.

14. The semiconductor package assembly of claim 12, wherein the upper surface of the die contact portion is exposed from the upper surface of the encapsulant body, and wherein a lower surface of the die pad is exposed from the lower surface of the encapsulant body.

15. A method of forming an interconnect clip, the method comprising:
providing a sheet metal;
forming a die contact portion, a bridge portion and a first transition surface from the sheet metal, the die contact portion and the bridge portion each comprising opposing upper and lower surfaces, the first transition surface extending transversely from the lower surface of the bridge portion to the lower surface of the die contact portion;
forming a lead contact portion from the sheet metal, the lead contact portion adjoining the bridge portion and comprising a lead contact surface or contact point,
wherein the lower surface of the die contact portion is formed to extend along a first plane,
wherein the lower surface of the bridge portion is formed to extend along a second plane that is completely above the first plane throughout a complete length of the bridge portion.

16. The method of claim 15, wherein the sheet metal comprises substantially planar upper and lower surfaces that are parallel to and opposite from one another and an edge side extending between the upper and lower surfaces of the sheet metal, and wherein forming the die contact portion and the bridge portion comprises punching the lower surface of the sheet metal thereby forming a punched region that is thinner than an unpunched region and extends to the edge side, wherein the unpunched region provides the upper and lower surfaces of the die contact portion, and wherein the punched region provides the upper and lower surfaces of the bridge portion.

17. The method of claim 16, wherein forming the lead contact portion comprises bending a portion of the punched region downward by applying a machine tool to the upper surface of the sheet metal in the punched region.

18. The method of claim 17, wherein the lead contact portion is formed to comprise the lead contact surface, and wherein the lead contact surface is a substantially planar lower surface of the interconnect clip that extends along a third plane that is completely below the first plane.

19. The method of claim 18, wherein the lead contact surface is formed by arranging a planar pad beneath the punched region while the machine tool applies force to the upper surface of the sheet metal.

20. The method of claim 19, wherein the planar pad provides counteracting force that maintains the lower surface of the sheet metal along a single plane while punched region bends downward by the force from the machine tool.

* * * * *

UNITED STATES PATENT AND TRADEMARK OFFICE
CERTIFICATE OF CORRECTION

PATENT NO. : 11,183,451 B2
APPLICATION NO. : 16/991532
DATED : November 23, 2021
INVENTOR(S) : Lee et al.

Page 1 of 1

It is certified that error appears in the above-identified patent and that said Letters Patent is hereby corrected as shown below:

In the Claims

Column 20, Line 31 (Claim 20, Line 3) please change "while punched" to -- while the punched --

Signed and Sealed this
Twenty-second Day of February, 2022

Drew Hirshfeld
*Performing the Functions and Duties of the*
*Under Secretary of Commerce for Intellectual Property and*
*Director of the United States Patent and Trademark Office*